US012132435B2

(12) United States Patent
Oliveti et al.

(10) Patent No.: US 12,132,435 B2
(45) Date of Patent: Oct. 29, 2024

(54) METHOD FOR REPEATABLE STEPPER MOTOR HOMING

(71) Applicant: COMET TECHNOLOGIES USA, INC., San Jose, CA (US)

(72) Inventors: Anthony Oliveti, San Jose, CA (US); J. Kirkwood Rough, San Jose, CA (US); Daniel Catalan, San Jose, CA (US); Gary Russell, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 271 days.

(21) Appl. No.: 17/974,884

(22) Filed: Oct. 27, 2022

(65) Prior Publication Data
US 2024/0146219 A1    May 2, 2024

(51) Int. Cl.
*H02P 8/08*      (2006.01)
*H01G 5/16*      (2006.01)
*H02P 8/34*      (2006.01)
*H01J 37/32*     (2006.01)
*H03H 7/38*      (2006.01)

(52) U.S. Cl.
CPC ............... *H02P 8/34* (2013.01); *H01G 5/16* (2013.01); *H01J 37/32183* (2013.01); *H03H 7/38* (2013.01)

(58) Field of Classification Search
CPC ..... H02P 8/08; H02P 8/12; H02P 8/34; H03H 7/38; G05B 19/40
See application file for complete search history.

(56) References Cited

U.S. PATENT DOCUMENTS

| 4,679,007 A | 7/1987 | Reese et al. |
| 5,175,472 A | 12/1992 | Johnson, Jr. et al. |
| 5,195,045 A | 3/1993 | Keane et al. |
| 5,394,061 A | 2/1995 | Fujii |

(Continued)

FOREIGN PATENT DOCUMENTS

| JP | 04239211 A | 8/1992 |
| JP | 05284046 A | 8/1993 |

(Continued)

OTHER PUBLICATIONS

PCT/US2018/062851—International Search Report and Written Opinion of International Searching Authority, dated Aug. 28, 2019, 10 pages.

(Continued)

*Primary Examiner* — Cortez M Cook
(74) *Attorney, Agent, or Firm* — Nolte Lackenbach Siegel

(57) ABSTRACT

A method for homing a stepping motor having a plurality of full-step positions within each full rotation of a rotor of the stepper motor includes applying a first drive current to windings of the stepper motor to rotate the rotor at least one full rotation in a first direction away from an end-of-travel (EOT) position. Thereafter, the drive current is applied to the windings to rotate the rotor in a second direction toward the EOT position. Upon detection of EOT, the drive current is discontinued. Drive current is then applied to the windings to rotate the rotor of the stepper motor in micro-steps in the first direction to a closest full-step position of the stepper motor. Finally, a drive current is applied to drive the stepper motor a predetermined number of full steps away from the EOT position.

14 Claims, 7 Drawing Sheets

(56) References Cited

U.S. PATENT DOCUMENTS

| | | | |
|---|---|---|---|
| 5,474,648 A | 12/1995 | Patrick et al. | |
| 5,501,201 A * | 3/1996 | Miyoshi | H02P 8/08 |
| | | | 123/568.24 |
| 5,576,629 A | 11/1996 | Turner et al. | |
| 5,609,737 A | 3/1997 | Fukui et al. | |
| 5,629,653 A | 5/1997 | Stimson | |
| 5,737,175 A | 4/1998 | Grosshart et al. | |
| 5,792,261 A | 8/1998 | Hama et al. | |
| 5,810,963 A | 9/1998 | Tomioka | |
| 5,842,154 A | 11/1998 | Harnett et al. | |
| 5,849,136 A | 12/1998 | Mintz et al. | |
| 5,866,869 A | 2/1999 | Schneider | |
| 5,889,252 A | 3/1999 | Williams et al. | |
| 5,910,886 A | 6/1999 | Coleman | |
| 5,914,974 A | 6/1999 | Partlo | |
| 6,016,131 A | 1/2000 | Sato et al. | |
| 6,157,179 A | 12/2000 | Miermans | |
| 6,164,241 A | 12/2000 | Chen et al. | |
| 6,252,354 B1 | 6/2001 | Collins et al. | |
| 6,313,584 B1 | 11/2001 | Johnson et al. | |
| 6,313,587 B1 | 11/2001 | MacLennan et al. | |
| 6,326,597 B1 | 12/2001 | Lubomirsky et al. | |
| 6,407,648 B1 | 6/2002 | Johnson | |
| 6,455,437 B1 | 9/2002 | Davidow et al. | |
| 6,463,875 B1 | 10/2002 | Chen et al. | |
| 6,507,155 B1 | 1/2003 | Barnes et al. | |
| 6,677,828 B1 | 1/2004 | Harnett et al. | |
| 6,703,080 B2 | 3/2004 | Reyzelman | |
| 6,806,437 B2 | 10/2004 | Oh | |
| 6,876,155 B2 | 4/2005 | Howald et al. | |
| 6,894,245 B2 | 5/2005 | Hoffman | |
| 6,949,887 B2 | 9/2005 | Kirkpatrick et al. | |
| 7,030,335 B2 | 4/2006 | Hoffman | |
| 7,042,311 B1 | 5/2006 | Hilliker et al. | |
| 7,079,597 B1 | 7/2006 | Kenwood | |
| 7,102,292 B2 | 9/2006 | Parsons et al. | |
| 7,192,505 B2 | 3/2007 | Roche et al. | |
| 7,196,283 B2 | 3/2007 | Buchberger, Jr. | |
| 7,215,697 B2 | 5/2007 | Hill et al. | |
| 7,220,937 B2 | 5/2007 | Hoffman | |
| 7,251,121 B2 | 7/2007 | Bhutta | |
| 7,259,623 B2 | 8/2007 | Coleman | |
| 7,298,128 B2 | 11/2007 | Bhutta | |
| 7,467,612 B2 | 12/2008 | Suckewer | |
| 7,514,936 B2 | 4/2009 | Anwar | |
| 7,795,877 B2 | 9/2010 | Radtke | |
| 7,796,368 B2 | 9/2010 | Kotani | |
| 8,169,162 B2 | 5/2012 | Yuzurihara | |
| 8,203,372 B2 | 6/2012 | Arduini | |
| 8,222,822 B2 | 7/2012 | Gilbert | |
| 8,421,377 B2 | 4/2013 | Kirchmeier | |
| 8,466,622 B2 | 6/2013 | Knaus | |
| 8,471,746 B2 | 6/2013 | Kurunezi et al. | |
| 8,491,759 B2 | 7/2013 | Pipitone et al. | |
| 8,742,669 B2 | 6/2014 | Carter et al. | |
| 8,779,662 B2 | 7/2014 | Boston | |
| 8,803,424 B2 | 8/2014 | Boston | |
| 8,884,180 B2 | 11/2014 | Ilie | |
| 8,896,391 B2 | 11/2014 | du Toit | |
| 8,928,229 B2 | 1/2015 | Boston | |
| 9,042,121 B2 | 5/2015 | Walde et al. | |
| 9,065,426 B2 | 6/2015 | Mason et al. | |
| 9,105,447 B2 | 8/2015 | Brouk et al. | |
| 9,111,725 B2 | 8/2015 | Boston | |
| 9,124,248 B2 | 9/2015 | Van Zyl et al. | |
| 9,142,388 B2 | 9/2015 | Hoffman et al. | |
| 9,148,086 B2 | 9/2015 | Fife et al. | |
| 9,166,481 B1 | 10/2015 | Vinciarelli | |
| 9,171,700 B2 | 10/2015 | Gilmore | |
| 9,196,459 B2 | 11/2015 | Bhutta | |
| 9,208,992 B2 | 12/2015 | Brouk et al. | |
| 9,224,579 B2 | 12/2015 | Finley et al. | |
| 9,225,299 B2 | 12/2015 | Mueller et al. | |
| 9,287,098 B2 | 3/2016 | Finley et al. | |
| 9,294,100 B2 | 3/2016 | Van Zyl et al. | |
| 9,306,533 B1 | 4/2016 | Mavretic | |
| 9,313,870 B2 | 4/2016 | Walde et al. | |
| 9,337,804 B2 | 5/2016 | Mason et al. | |
| 9,345,122 B2 | 5/2016 | Bhutta | |
| 9,385,021 B2 | 7/2016 | Chen | |
| 9,418,822 B2 | 8/2016 | Kaneko | |
| 9,478,397 B2 | 10/2016 | Blackburn et al. | |
| 9,483,066 B2 | 11/2016 | Finley et al. | |
| 9,490,353 B2 | 11/2016 | Van Zyl et al. | |
| 9,496,122 B1 | 11/2016 | Bhutta | |
| 9,520,269 B2 | 12/2016 | Finley et al. | |
| 9,524,854 B2 | 12/2016 | Hoffman et al. | |
| 9,525,412 B2 | 12/2016 | Mavretic | |
| 9,536,713 B2 | 1/2017 | Van Zyl et al. | |
| 9,543,122 B2 | 1/2017 | Bhutta | |
| 9,544,987 B2 | 1/2017 | Mueller et al. | |
| 9,558,917 B2 | 1/2017 | Finley et al. | |
| 9,577,516 B1 | 2/2017 | Van Zyl et al. | |
| 9,584,090 B2 | 2/2017 | Mavretic | |
| 9,578,731 B2 | 3/2017 | Hoffman et al. | |
| 9,591,739 B2 | 3/2017 | Bhutta | |
| 9,589,767 B2 | 4/2017 | Finley et al. | |
| 9,620,340 B2 | 4/2017 | Finley et al. | |
| 9,651,957 B1 | 5/2017 | Finley et al. | |
| 9,660,613 B2 | 5/2017 | Van Zyl et al. | |
| 9,673,028 B2 | 6/2017 | Walde et al. | |
| 9,697,911 B2 | 7/2017 | Bhutta | |
| 9,711,331 B2 | 7/2017 | Mueller et al. | |
| 9,711,335 B2 | 7/2017 | Christie et al. | |
| 9,728,378 B2 | 8/2017 | Bhutta et al. | |
| 9,729,122 B2 | 8/2017 | Mavretic | |
| 9,741,544 B2 | 8/2017 | Van Zyl et al. | |
| 9,745,660 B2 | 8/2017 | Bhutta | |
| 9,748,076 B1 | 8/2017 | Choi et al. | |
| 9,755,641 B1 | 9/2017 | Bhutta | |
| 9,773,644 B2 | 9/2017 | Van Zyl et al. | |
| 9,807,863 B1 | 10/2017 | Van Zyl et al. | |
| 9,812,305 B2 | 11/2017 | Pelleymounter et al. | |
| 9,844,127 B2 | 12/2017 | Bhutta | |
| 9,852,890 B2 | 12/2017 | Mueller et al. | |
| 9,854,659 B2 | 12/2017 | Van Zyl et al. | |
| 9,865,432 B1 | 1/2018 | Bhutta | |
| 9,952,297 B2 | 4/2018 | Wang | |
| 10,008,317 B2 | 6/2018 | Iyer | |
| 10,020,752 B1 | 7/2018 | Vinciarelli | |
| 10,026,592 B2 | 7/2018 | Chen | |
| 10,026,594 B2 | 7/2018 | Bhutta | |
| 10,026,595 B2 | 7/2018 | Choi et al. | |
| 10,074,518 B2 | 9/2018 | Van Zyl et al. | |
| 10,139,285 B2 | 11/2018 | Murray et al. | |
| 10,141,788 B2 | 11/2018 | Kamstedt | |
| 10,194,518 B2 | 1/2019 | Van Zyl et al. | |
| 10,217,618 B2 | 2/2019 | Larson et al. | |
| 10,224,184 B2 | 3/2019 | Van Zyl et al. | |
| 10,224,186 B2 | 3/2019 | Polak et al. | |
| 10,263,577 B2 | 4/2019 | Van Zyl et al. | |
| 10,269,540 B1 | 4/2019 | Carter et al. | |
| 10,314,156 B2 | 6/2019 | Van Zyl et al. | |
| 10,332,730 B2 | 6/2019 | Christie et al. | |
| 10,340,879 B2 | 7/2019 | Mavretic | |
| 10,373,811 B2 | 8/2019 | Christie et al. | |
| 10,374,070 B2 | 8/2019 | Wood | |
| 10,410,836 B2 | 9/2019 | McChesney | |
| 10,411,769 B2 | 9/2019 | Bae | |
| 10,447,174 B1 | 10/2019 | Porter, Jr. et al. | |
| 10,469,108 B2 | 11/2019 | Howald | |
| 10,475,622 B2 | 11/2019 | Pankratz et al. | |
| 2003/0121609 A1 | 7/2003 | Ohmi et al. | |
| 2003/0150710 A1 | 8/2003 | Evans et al. | |
| 2003/0230984 A1 | 12/2003 | Kitamura et al. | |
| 2004/0016402 A1 | 1/2004 | Walther et al. | |
| 2004/0026235 A1 | 2/2004 | Stowell, Jr. | |
| 2005/0034811 A1 | 2/2005 | Mahoney et al. | |
| 2005/0045475 A1 | 3/2005 | Wantanabe | |
| 2005/0116678 A1 * | 6/2005 | Yamada | G05B 19/40 |
| | | | 318/685 |
| 2005/0270805 A1 | 12/2005 | Yasumura | |
| 2006/0005928 A1 | 1/2006 | Howald | |
| 2006/0169582 A1 | 8/2006 | Brown et al. | |

(56) References Cited

U.S. PATENT DOCUMENTS

| | | |
|---|---|---|
| 2006/0169584 A1 | 8/2006 | Brown et al. |
| 2006/0249729 A1 | 11/2006 | Mundt et al. |
| 2007/0121267 A1 | 5/2007 | Kotani |
| 2007/0222428 A1 | 9/2007 | Garvin et al. |
| 2007/0296370 A1* | 12/2007 | Torikoshi ............... H02P 8/08 318/696 |
| 2008/0061793 A1 | 3/2008 | Anwar et al. |
| 2008/0061901 A1 | 3/2008 | Gilmore |
| 2008/0087381 A1 | 4/2008 | Shannon et al. |
| 2008/0197854 A1 | 8/2008 | Valcore et al. |
| 2008/0272875 A1 | 11/2008 | Huang et al. |
| 2008/0317974 A1 | 12/2008 | de Vries |
| 2009/0026964 A1 | 1/2009 | Knaus |
| 2009/0206974 A1 | 8/2009 | Meinke |
| 2010/0012029 A1 | 1/2010 | Forester et al. |
| 2010/0072172 A1 | 3/2010 | Ui et al. |
| 2010/0096261 A1 | 4/2010 | Hoffman et al. |
| 2010/0098882 A1 | 4/2010 | Lubomirsky et al. |
| 2010/0159120 A1 | 6/2010 | Dzengeleski et al. |
| 2011/0121735 A1 | 5/2011 | Penny |
| 2011/0140607 A1 | 6/2011 | Moore et al. |
| 2011/0148303 A1 | 6/2011 | Van Zyl et al. |
| 2011/0174777 A1 | 7/2011 | Jensen et al. |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0164834 A1 | 6/2012 | Jennings et al. |
| 2012/0262064 A1 | 10/2012 | Nagarkatti |
| 2013/0002136 A1 | 1/2013 | Blackburn et al. |
| 2013/0140984 A1 | 6/2013 | Hirayama |
| 2013/0180964 A1 | 7/2013 | Ilic |
| 2013/0214683 A1 | 8/2013 | Valcore et al. |
| 2013/0240482 A1 | 9/2013 | Nam et al. |
| 2013/0278140 A1 | 10/2013 | Mudunuri et al. |
| 2013/0345847 A1 | 12/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0328027 A1 | 11/2014 | Zhang et al. |
| 2014/0367043 A1 | 12/2014 | Bishara et al. |
| 2015/0002020 A1 | 1/2015 | Boston |
| 2015/0115797 A1 | 4/2015 | Yuzurihara |
| 2015/0150710 A1 | 6/2015 | Evans et al. |
| 2015/0313000 A1 | 10/2015 | Thomas et al. |
| 2016/0002020 A1 | 1/2016 | Orita |
| 2016/0248396 A1 | 8/2016 | Mavretic |
| 2016/0308560 A1 | 10/2016 | Howald et al. |
| 2017/0018349 A1 | 1/2017 | Otsubo et al. |
| 2017/0133886 A1 | 5/2017 | Kurs et al. |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0102238 A1 | 4/2018 | Gu et al. |
| 2018/0261431 A1 | 9/2018 | Hammond, IV |
| 2019/0172683 A1 | 6/2019 | Mavretic |
| 2019/0199241 A1 | 6/2019 | Satoshi et al. |
| 2019/0385822 A1 | 12/2019 | Marakhtanov et al. |
| 2021/0006187 A1* | 1/2021 | Nagahama ............... H02P 8/12 |

FOREIGN PATENT DOCUMENTS

| | | |
|---|---|---|
| JP | 2006-310245 A | 6/2008 |
| JP | 2010-016124 A | 1/2010 |
| JP | 2015-502213 A | 1/2015 |
| KR | 10-2006-0067957 A | 6/2006 |
| KR | 10-2014-0077866 A | 6/2014 |
| KR | 10-2017-0127724 A | 11/2017 |
| KR | 10-2018-0038596 A | 4/2018 |
| WO | 2012054305 | 4/2012 |
| WO | 2012054306 | 4/2012 |
| WO | 2012054307 | 4/2012 |
| WO | 2016048449 A1 | 3/2016 |
| WO | 2016097730 | 6/2016 |
| WO | 2019096564 A1 | 5/2019 |
| WO | 2019147513 A1 | 8/2019 |
| WO | 2019-244734 A1 | 12/2019 |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

* cited by examiner

METHOD FOR REPEATABLE STEPPER MOTOR HOMING

BACKGROUND

Stepper motors are used in a variety of applications. Stepper motors typically have a plurality of steps within a complete (360-degree) rotation of a rotor, enabling the precise positioning of the rotor within the multiple rotations of that rotor as it progress through a pre-defined range of motion. These steps may be defined by magnetic "teeth" on the stator and rotor of the stepper motor. Current may be applied to the windings of a stepper motor to control step-wise movement of the rotor, and may also be applied to control movement of the rotor in fractions of each step, referred to as "micro-stepping."

Stepper motors may be used to dynamically control the positioning of a movable electrode assembly in a variable capacitor. Variable capacitors may be used in applications involving high frequency, high power signals. Variable capacitors may be utilized, for example, in oscillation circuits for high-power radio transmission, high-frequency power supplies for semiconductor manufacturing equipment, and impedance matching networks in which the impedance of a dynamic, high-frequency load is to be matched with that of a generator.

A capacitor consists essentially of at least two spaced-apart capacitor plates with an insulator or dielectric material disposed between the capacitor plates. As used herein, the terms "dielectric," "dielectric material" and "dielectric medium" are interchangeably used to refer to a material (i.e., solid, liquid, or gas) which is polarizable in the presence of an electric field, typically expressed in terms of the material's electrical susceptibility $\chi$.

In a vacuum variable capacitor, the at least two capacitor plates are maintained in a high vacuum, (e.g., $10^{-6}$ Torr or less) which serves as the capacitor's dielectric, having a susceptibility $\chi \approx 0$. In some vacuum variable capacitors, the capacitor plates may be configured as a plurality of inter-digitated, concentric plates, and the variability of capacitance may be achieved through physically adjusting the length of overlapping in the interdigitation.

BRIEF DESCRIPTION OF THE DRAWINGS

The present disclosure is best understood from the following detailed description when read with the accompanying figures, wherein.

Figure 1A:
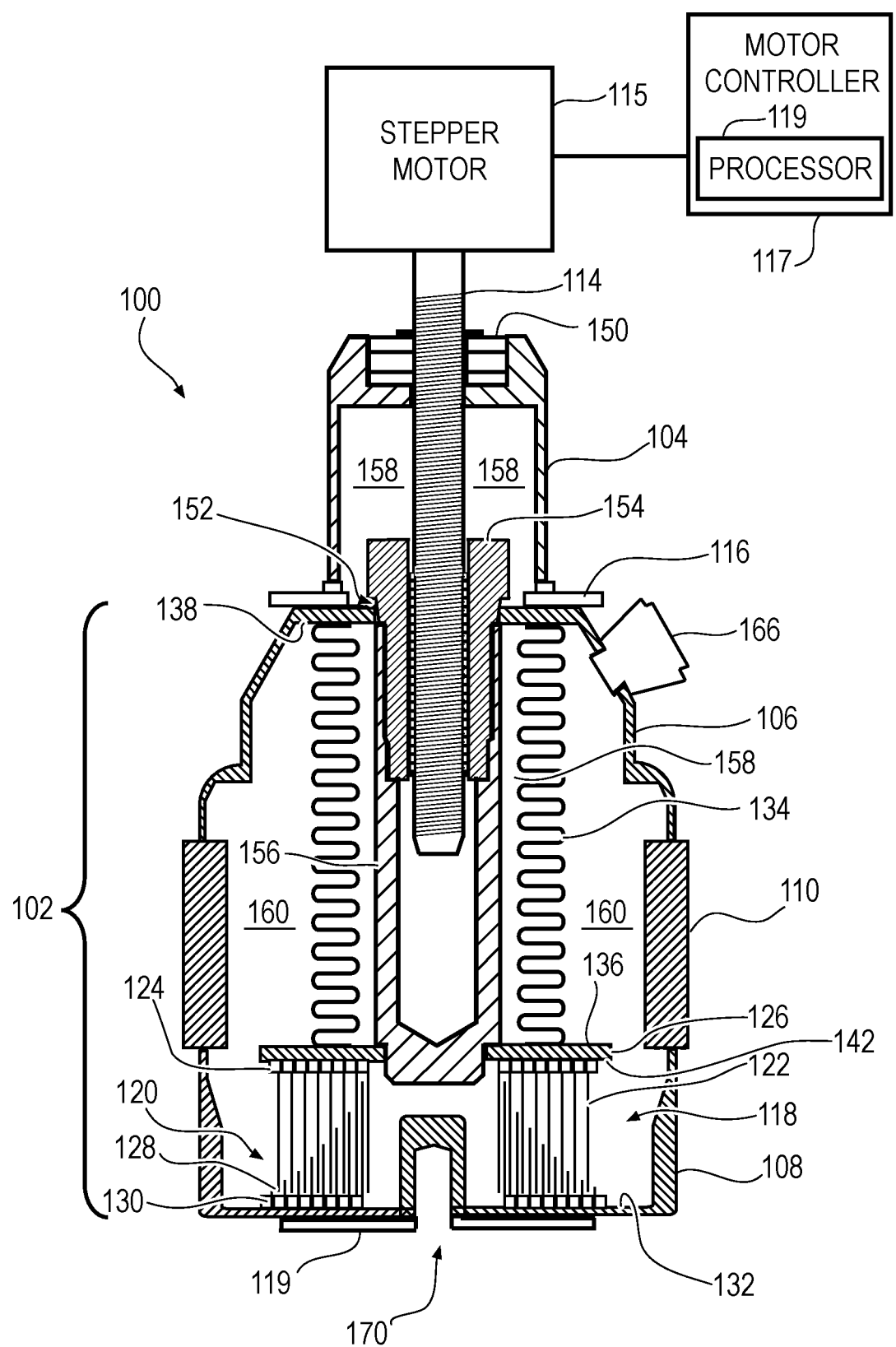
FIGS. 1A and 1B are side cross-sectional views of a vacuum variable capacitor according to one or more examples.

It is emphasized that, in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described for every example in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

The expressions such as "include" and "may include" which may be used in the present disclosure denote the presence of the disclosed functions, operations, and constituent elements, and do not limit the presence of one or more additional functions, operations, and constituent elements. In the present disclosure, terms such as "include" and/or "have", may be construed to denote a certain characteristic, number, operation, constituent element, component or a combination thereof, but should not be construed to exclude the existence of or a possibility of the addition of one or more other characteristics, numbers, operations, constituent elements, components or combinations thereof.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

As used herein, to "provide" an item means to have possession of and/or control over the item. This may include, for example, forming (or assembling) some or all of the item from its constituent materials and/or, obtaining possession of and/or control over an already-formed item.

Unless otherwise defined, all terms including technical and/or scientific terms used herein have the same meaning as commonly understood by one of ordinary skill in the art to which the present disclosure pertains. In addition, unless otherwise defined, all terms defined in generally used dictionaries may not be overly interpreted.

The subject matter herein is described in the context of variable capacitors including stepper motors for controlling variable capacitance through advancement and retraction of an actuator attached to a rotor of the stepper motor. In examples, a method is employed to detect back electromotive force (back-EMF) of windings in a stepper motor for the purpose of establishing a "home" position of the actuator. The method of examples herein eliminate the complexity and expense of including an encoder, such as an optical encoder, for physically measuring or detecting the precise position of the stepper motor's rotor.

Figure 1B:
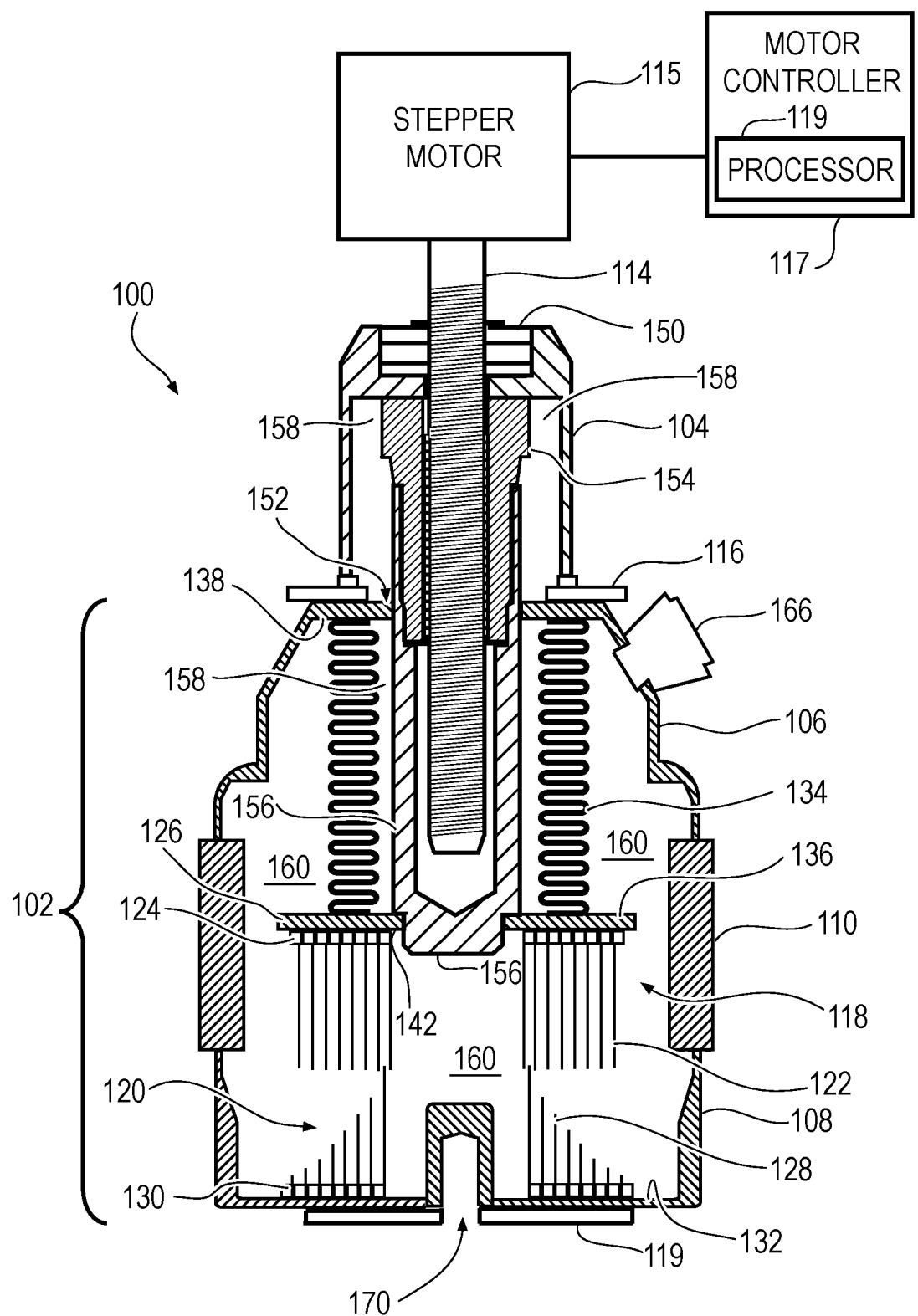

FIGS. 1A and 1B are side cross-sectional views of a vacuum variable capacitor 100 according to one or more examples. Vacuum variable capacitor 100 includes an enclosure 102 with an actuator end cap 104 as hereinafter described. In the example of FIGS. 1A and 1B, enclosure 102 includes a first conductive collar 106 and a second conductive collar 108 electrically insulated from one another by an intermediate electrically insulating element 110 joined in a hermetic manner to conductive collars 106 and 108. In examples, conductive collars 106 and 108 may be a metal such as silver-plated copper, copper, brass, aluminum, or brazed aluminum. In examples, intermediate electrically insulating element 110 may be substantially cylindrical, and may be made of ceramic or another suitable insulating material.

An upper end of an actuator 114 extends out of actuator end cap 104. In some examples, actuator 114 may threaded, and may be rotated, such as with a stepper motor, to advance and retract a movable capacitor assembly within enclosure 102. In other examples, actuator 114 may be advanced and retracted by means of a linear motor, an electromagnetic coil arrangement, or hydraulic or pneumatic systems. In examples, a first conductive mounting plate 116 may be provided in electrical contact with first conductive collar 106 to facilitate physical installation of vacuum variable capacitor 100 in operating environments. First conductive mounting plate 116 may further provide an external electrical connection to vacuum variable capacitor 100 as herein described. Vacuum variable capacitor 100 may further include a second conductive mounting plate 119 in electrical contact with conductive collar 108 to further facilitate installation of vacuum variable capacitor in operating environments.

As illustrated in FIGS. 1A and 1B, contained within enclosure 102 are a first (movable) capacitor plate assembly 118 and a second capacitor plate assembly 120. First (movable) capacitor plate assembly 118 includes a first capacitor plate 122 coupled to a first electrode 124. First electrode 124 of first (movable) capacitor plate assembly 118 is coupled to the underside of a first mounting plate 126. Second capacitor plate assembly 120 includes a second capacitor plate 128 coupled to a second electrode 130. Second electrode of second capacitor plate assembly 120 is coupled to a bottom portion 132 of conductive collar 108.

In examples, first capacitor plate 122 and second capacitor plate 128 may comprise concentric cylindrical coil capacitor plates, with first capacitor plate 122 being electrically attached at a top end to first electrode 124 and configured as a cylindrical coil and second capacitor plate 128 attached at bottom end to second electrode 130 configured as a cylindrical coil. In this example, second capacitor plate varies in height from a maximum height at a central portion 140 of the capacitor plate coil to a minimum height at an outer portion 143 of the capacitor plate coil. (As used herein, the term "height" when describing a capacitor plate refers to the dimension of the capacitor plate extending away from a respective mounting plate.)

In examples, first and second capacitor plate assemblies 118 and 120 are configured such that first mounting plate 126 and bottom portion 132 of second collar 108 may be positioned relative to each other to enable first capacitor plate 122 to at least partially concentrically interdigitate with second capacitor plate 128. FIG. 1A shows first (movable) capacitor plate assembly advanced to its lowest position (relative to actuator end cap 104), providing maximum interdigitation between first capacitor plate 122 and second capacitor plate 128, and hence providing maximum capacitance of vacuum variable capacitor 100. In examples, the total travel of first (movable) capacitor plate assembly may be twenty millimeters. The thread pitch of actuator 114 may be such that actuator 114 must be rotated approximately ten complete rotations to move thrust collar 154 this distance.

FIG. 1B shows first (movable) capacitor plate assembly retracted to its highest position (again, relative to actuator end cap 104), providing minimum interdigitation between first capacitor plate 122 and second capacitor plate 128, and hence providing minimum capacitance of vacuum variable capacitor 100. In examples, the highest position depicted in FIG. 1B may be considered the "home" position of first (movable) capacitor plate assembly 118.

In examples, first capacitor plate 122 and second capacitor plate 128 do not contact each other directly, although the spacing between first mounting plate 126 and bottom portion 132 of second collar 108 may be adjusted, as described herein, to vary the length of concentric, overlapping interdigitation between first capacitor plate 122 and second capacitor plate 128, thereby adjusting the effective capacitance established between first capacitor plate 122 and second capacitor plate 128. In examples, first and second capacitor plates 122 and 128 may be made of materials (e.g., oxygen-free copper or copper-plated brass) conventionally used for such structures in a vacuum variable capacitor.

With continued reference to FIGS. 1A and 1B, in one or more examples a flexible structure 134 is in sealed attachment between a top surface 136 of first mounting plate 126 and an inner top portion 138 of first collar 106. First electrode 124 is mechanically and electrically coupled to a bottom surface 142 of first mounting plate 126.

As shown in FIGS. 1A and 1B, actuator 114 extends through one or more gaskets or bearings 150 in actuator end cap 104 and through an aperture 152 in first collar 106, extending partially into flexible structure 134. In one or more examples, actuator 114 threadably engages a thrust assembly comprising a thrust collar 154 and an extended coupling 156 secured to first mounting plate 126.

A plurality of separate volumes are defined within enclosure 102. In particular, a first volume 158 is defined within actuator end cap 104 and within the interior of flexible structure 134. (Multiple reference numerals 158 appear in FIGS. 1A and 1B to indicate the extent of first volume 158).

A second volume 160 is defined within enclosure 102. (Again, multiple reference numerals 160 appear in FIGS. 1A and 1B to indicate the extent of second volume 160). Second volume 160 is defined outside of flexible structure 134, within intermediate electrically insulating element 110, within second collar 108, between first and second capacitor plates 122 and 128.

In examples, first volume 158 may be at or near external, atmospheric pressure, due to a possibly nominal seal between actuator 114 and gaskets 150 as actuator enters actuator end cap 104. On the other hand, second volume 160 is hermetically (i.e., vacuum- and liquid-tight) sealed, due to sealed attachment of flexible structure 134 to first collar 106 and to first mounting plate 126, such as by brazing.

According to the present examples, the extent of interdigitated overlapping of first capacitor plate 122 and second capacitor plate 128, and hence the capacitive performance of vacuum variable capacitor, may be adjusted through rotation of actuator 114. In the example of FIGS. 1A and 1B, a stepper motor 115 is provided to rotate actuator 114 in precise increments, thereby causing threads of actuator 114 to raise or lower thrust collar 154 and extended coupling 156, to raise and lower first mounting plate 126 relative to second mounting plate 132. That is, in these examples, first mounting plate 126, carrying first (movable) capacitor plate assembly 118, is movable with respect to bottom portion 132 of second collar 108, carrying second capacitor plate assembly 120. A motor controller 117 may be provided to provide variable operating currents to the windings of stepper motor 115 to control rotation of the stepper motor, as herein described. Motor controller 117 may include a hardware processor 119. In various examples, hardware processor 119 may be, for example and without limitation, a microcontroller, a central processing unit ("CPU"), a digital signal processor ("DSP"), a programmed logic array (PLA), or a custom processing circuit. Processor 119 may perform the processing steps described hereinbelow with reference to FIG. 3, in order to control stepper motor 115 according to examples herein.

As noted, FIG. 1A shows vacuum variable capacitor 100 in a first operational configuration, in which thrust collar 154 and extended coupling 156 are advanced to a maximum extent into enclosure 102, such that the interdigitated overlap between first capacitor plate 122 and second capacitor plate 128 is at a maximum. This maximizes the capacitance between first capacitor plate 122 and second capacitor plate 128, due to the interdigitated overlap being at a maximum. FIG. 1B shows vacuum variable capacitor 100 in a second operational configuration, in which thrust collar 154 and extended coupling 156 are retracted to a maximum extent, such that the interdigitated overlap between first capacitor plate 122 and second capacitor plate 128 is at a minimum. This minimizes the capacitance between first capacitor plate 122 and second capacitor plate 128, due to the interdigitated overlap being at a minimum.

In other operational configurations, not specifically illustrated, in thrust collar 154 and extended coupling 156 may be retracted to a variable extents between the maximum extension shown in FIG. 1A and the maximum retraction shown in FIG. 1B, for example through rotation of actuator 114 by stepper motor 115, such that the interdigitated overlap between first capacitor plate 122 and second capacitor plate 128 is varied. This in turn varies the capacitance between first capacitor plate 122 and second capacitor plate 128. That is, in points between full advancement (FIG. 1A) and full retraction (FIG. 1B) of thrust collar 154, and extended coupling 156, capacitance varies according to the overall interdigitated overlap of first capacitor plate 122 and second capacitor plate 128.

In examples, first mounting plate 126, flexible structure 134, extended coupling 156, thrust collar 154, and mounting plate 116 are conductive (e.g., metallic) and provide a low-resistance electrical conduction path between first electrode 124, first collar 106, and mounting plate 116, which may serve as a first external electrical contact for vacuum variable capacitor 100. Second electrode 130 is coupled to bottom portion 132 of second collar 108, and to bottom conductive plate 119 which may be integral with (or electrically coupled to) second collar 108, thereby enabling second collar 108 and bottom conductive plate 119 to serve as a second electrical connection to vacuum variable capacitor 100. To facilitate attachment of an electrode plate, a threaded socket 170 may be provided in second collar 108.

As noted, precise control of the capacitance of vacuum variable capacitor depends in part on the ability to precisely and repeatedly return first (movable) electrode assembly 118 to a "home" position, such as the position of maximum retraction shown in FIG. 1B. Once in such home position, the movement of first (movable) electrode assembly 118 to desired positions is possible, and assists in maintaining precise control of the capacitance of vacuum variable capacitor 100.

That is, the home position is a reference point from which all subsequent movements of a movable capacitor plate are derived. Repeatably establishing the home position, referred to herein as "homing," with some degree of precision allows for a similar precision in control of the effective variable capacitance of a vacuum variable capacitor during operation. In examples herein, techniques are employed to minimize variations between homing operations (e.g., "repeatable homing").

An optical or mechanical encoder for monitoring rotation of a threaded actuator in a vacuum variable capacitor may be provided. This tends to increase the cost and complexity of the capacitor. Alternatively, and as described herein, certain electrical conditions associated with the operation of a stepper motor may be monitored to identify a home position with precision. In particular, an attribute of a stepper motor that may be used to control a vacuum variable capacitor is its back electromotive force ("back-EMF" or "induced EMF"). When the armature (rotor) of a stepper motor rotates under the influence of driving current, the armature of the stepper motor moves through a magnetic field inducing an electromotive force in the armature. The induced, or back-EMF is in the opposite direction to the driving current to the motor.

When a home position is encountered for a stepper motor, there is only a nominally precise "stop" of the motor's rotation as the motor settles into an end-of-travel ("EOT") position. As used herein, EOT refers to a condition in which rotation of the rotor of a stepper motor is impeded. Such a condition may be created, in some examples, when a shaft and/or a thrust collar on a shaft, coupled to a stepper motor's rotor, reaches a physical barrier.

The stopping of a stepper motor at an EOT position may be referred to as a "spongy" stop. The nominal precision of the stopping of the motor's rotation at EOT results from movement of the thrust collar 154 which may not stop instantaneously. Movement of thrust collar 154 may slow down more gradually, albeit perhaps over a relatively short distance. This slowing of movement may cause a change in the back-EMF of stepper motor 115. According to one or more examples, measurement and monitoring of the back-EMF of stepper motor 115 may enable a determination that the mechanism is in the range of movement close to the EOT position. It is to be noted that the EOT position of thrust collar 154 may not be the same as the desired home position for vacuum variable capacitor 100.

Stepper motor 115 may have a plurality of magnetic teeth on the rotor and stator to define the step-wise rotation of the stepper motor. For example, a stepper motor may have 200 teeth. One "step" of a stepper motor corresponds to the distance from tooth to tooth within the stepper motor. Thus, for a stepper motor having 200 teeth, each full rotation of the stepper motor (360 degrees) would require 200 full steps of the stepper motor.

In some examples, stepper motor 115 may be operable to perform so-called "micro-steps," in which drive current supplied to stepper motor 115 is manipulated to hold the rotor of stepper motor 115 at an intermediate position between two teeth. For example, stepper motor may be controlled to hold the rotor at a half-way point between two teeth. As long as sufficient torque compliance is provided, a stepper motor may be controlled to be adjusted to small increments, i.e., micro-steps between adjacent teeth on the rotor and stator.

Figure 2:
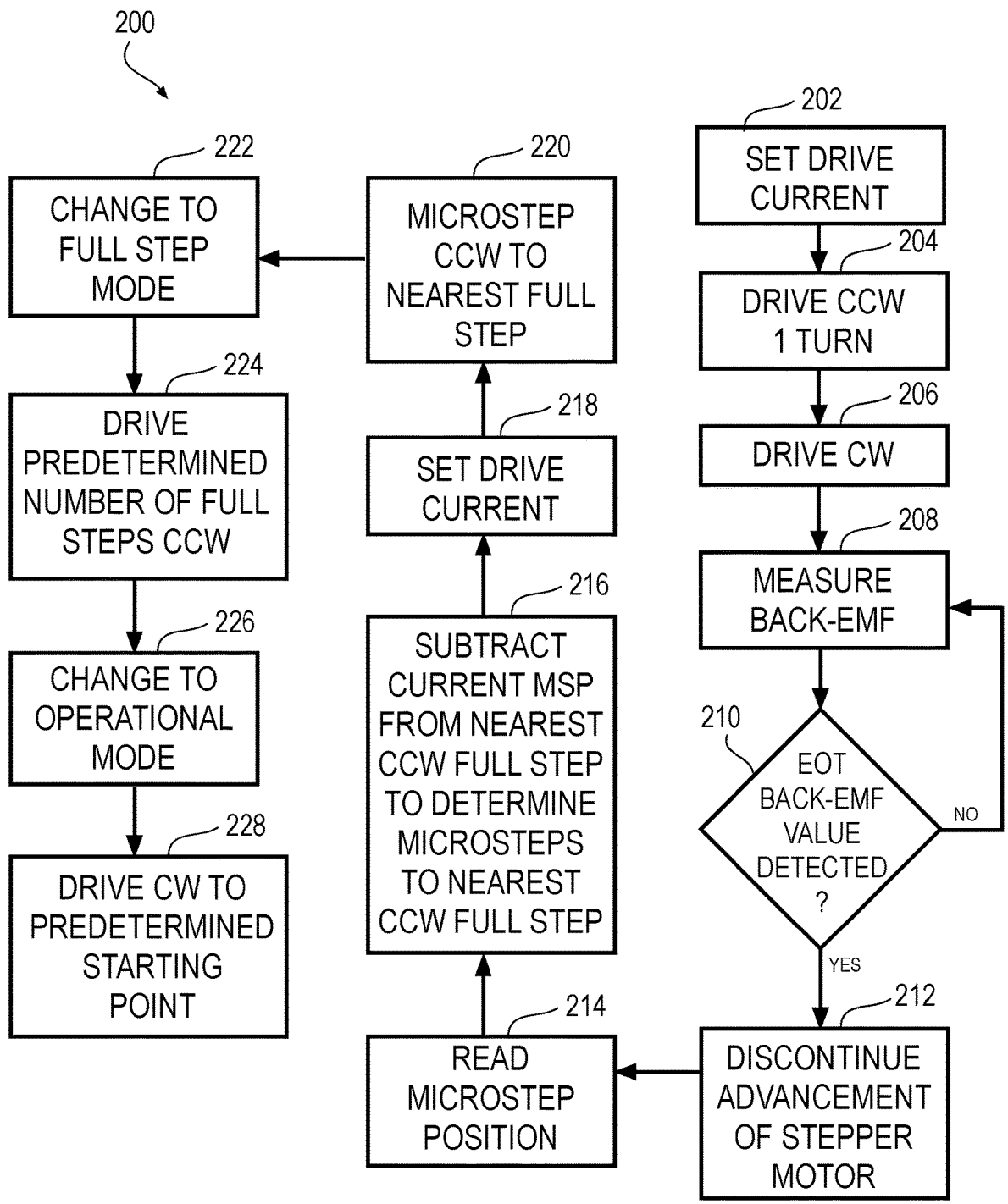
FIG. 2 is a flow diagram of a method for performing a homing operation for a stepper motor according to one or more examples.

FIG. 2 is a flow diagram of a method 200 for utilizing measurement of the back-EMF of stepper motor 115 to determine when thrust collar 154 has been driven to the EOT position. In examples, the method 200 performs a series of digital signal processing operations to create signals with maximal discriminatory features between normal motion and the approach to the EOT position, without disturbing the transient behavior of the signal. Thereafter, according to one or more examples, thrust collar 154 must then be advanced away from the EOT position, which may require overcoming break-away torquing forces. Break-away torquing forces may be a function of the amount of torque applied when driving thrust collar 154 into the EOT position. In examples, the method 200 of FIG. 2 uses a series of modifications to the stepping parameters of stepper motor 115, such as through modifying the driving current applied by motor controller 117 to the windings of stepper motor 115, as well as the micro-stepping depth of stepper motor 115, to generate more torque than the minimum required to break away from the stop position reliably and repeatedly.

Referring to FIG. 2, method 200 begins with an initial setting of a first drive current for stepper motor 115, in block 202. Next, in block 204, the selected drive current is used to drive stepper motor 115 one turn counter-clockwise. (As used herein, counter-clockwise, or "CCW," refers to rotation of actuator 114 in a direction to advance thrust washer 154 inward, and clockwise, or "CW," refers to rotation of actuator 114 in a direction to retract thrust washer 154 outward). In one example, the drive current is selected to control stepper motor 115 to turn a desired number of steps or micro-steps with a desired amount of torque.

In block 206, the selected drive current is then used to drive actuator clockwise. During this driving interval, in block 208, the back-EMF of stepper motor 115 is measured. In operation, the back-EMF of a stepper motor will collapse to zero as the stepper motor approaches its EOT position. The EOT position will not necessarily coincide with a full step of the stepper motor.

As noted, the measurement of the stepper motor back-EMF involves a series of digital signal processing operations. These operations may be performed by circuitry depicted in the schematic diagram of FIG. 3, (after an analog-to-digital conversion step 302 as described below).

Figure 3:
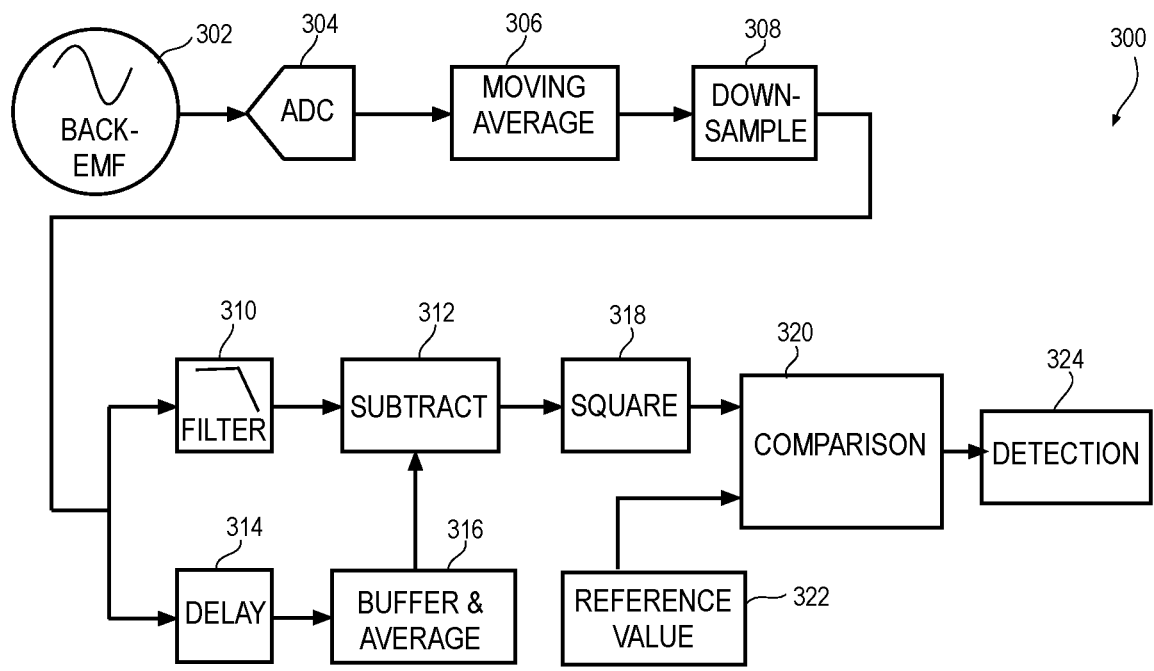
FIG. 3 is a schematic diagram of circuitry for measuring back electromotive force ("back-EMF") of a stepper motor according to one or more examples.

Referring to FIG. 3, the back-EMF measurement circuit receives the back-EMF signal 302 and applies it to an analog-to-digital converter ("ADC") 304 which periodically outputs digital values representing the magnitude of the back-EMF signal 302. These digital values are provided to processor 119 which performs the remaining functions shown in FIG. 3. A first function 306 is to maintain a simple moving average of the raw data from ADC 304. In one example, a sixteen-value moving average may be maintained. The periodicity of the ADC output values may be greater than necessary for the purposes of controlling the stepper motor, so in function block 308, the moving average values may be down-sampled.

Following down-sampling, the digitized moving average values are processed by a digital filter function 310 and to a delay function 314. In examples, filter function 310 may be an exponential moving average ("EMA") filter function. EMA filter function 310 is a discrete, low-pass, infinite-impulse response (IIR) filter. EMA filter function 314 places more weight on recent data by discounting old data in an exponential fashion, and behaves similarly to the discrete first-order low-pass resistance/capacitance filter. The output of delay function 314 is fed to a moving average buffer function 316, and the output of moving average buffer function 316 is subtracted, by a subtraction function 312, from the output of EMA filter function 310.

The output values from subtraction function 312 are then squared, in function block 318, and the squared values are applied to one input of a comparator function 320. Comparator function 322 receives a reference value 322, and the output of comparator function 320 produces a stop point detection signal 324. In examples, reference value 322 is predetermined to establish a threshold for detection of the EOT position for stepper motor 115.

Referring again to FIG. 2, once an EOT back-EMF value is detected in decision block 210, motor controller 117 discontinues micro-step advancement of stepper motor 115, in block 212. Next, in block 214, the micro-step position of stepper motor 115 is determined. This may be accomplished by accessing a micro-step register in motor controller 117 of stepper motor 115.

In block 216, the current micro-step position determined in block 214 is subtracted from the nearest CCW full step to determine the number of micro-steps required to advance stepper motor 115 to the nearest full step. In an ideal situation, EOT position detected in block 210 may coincide with a full step of stepper motor 115. Otherwise, the advancement in block 220 will place the stepper motor in the first full step away from the EOT position. Then, in block 218, the drive current may be set to a second value, after which in block 220, motor controller 117 micro-steps stepper motor 115 to the nearest full step. The second drive current value may be greater than the first drive current value, to ensure that break-away torque forces are sufficiently overcome.

With continued reference to FIG. 2, in block 222, motor controller 117 enters a full step mode, in which winding current may be applied sufficient to advance stepper motor 115 in full step increments. In block 224, motor controller 117 drives stepper motor 115 a predetermined number of full steps away from the full step reached in block 220. Thereafter, in block 226, motor controller 117 enters an operational mode, and in block 228, motor controller 117 drive stepper motor 115 to a predetermined starting point for operation.

Figure 4:
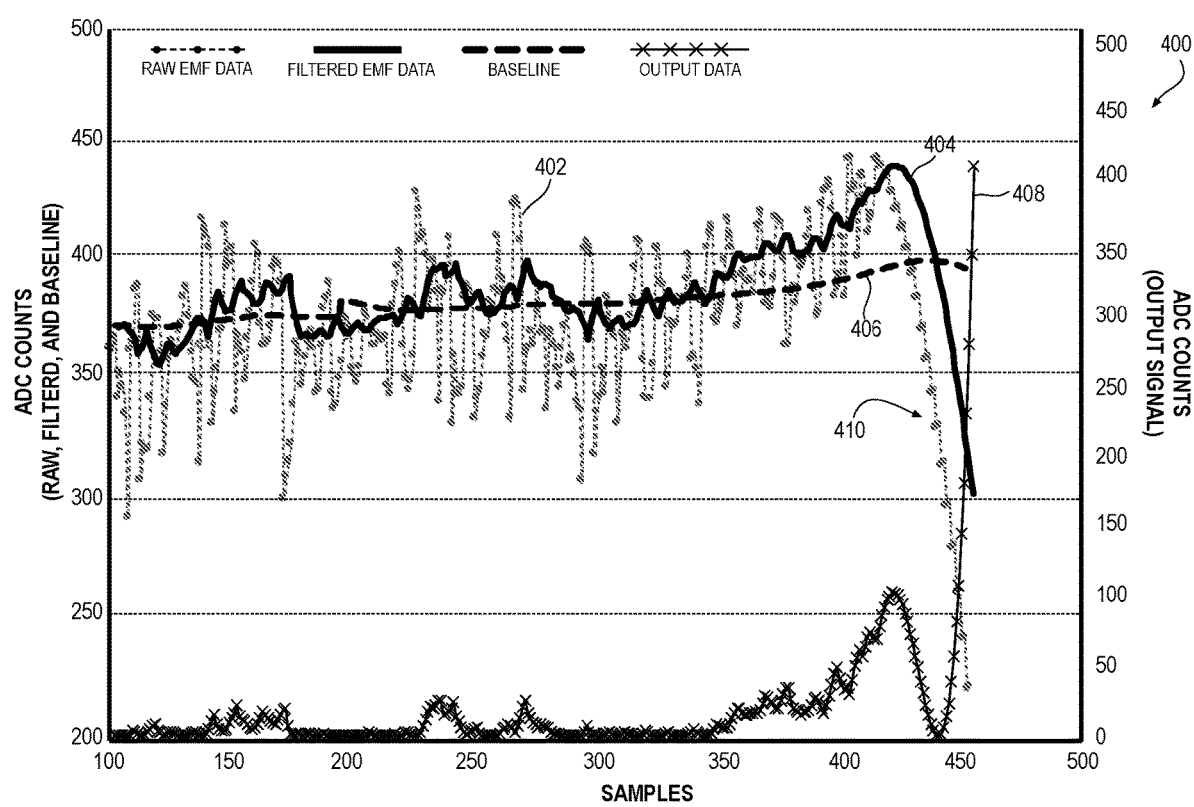
FIG. 4 is a plot of data associated with the measurement of back-EMF according to one or more examples.

FIG. 4 is a plot 400 of various signals generated during a homing process according to one or more examples. In FIG. 4, a curve 402 represents raw back-EMF data at the output of ADC 304 in the schematic of FIG. 3. A curve 404 in FIG. 4 represents filtered back-EMF data at the output of filter 310 in the schematic of FIG. 3. A curve 406 in FIG. 4 represents a baseline signal corresponding to the output of buffer 316 in the block diagram of FIG. 3. The baseline signal (curve 406) is subtracted from the filtered signal provided from exponential filter 310. The result is then squared (block 318 in FIG. 3) to generate a stop point detection signal 408. This signal is then compared to a reference value (comparator 320 in FIG. 3) to determine an EOT position. The squaring of the output of subtract block 312 in FIG. 3 compensates for the phase delay (reflected by the gap between 402 and 404 in the region designated generally with reference numeral 410 in FIG. 4) introduced inherently by the filtering in block 310, such that the EOT position may be accurately detected.

Figure 5:
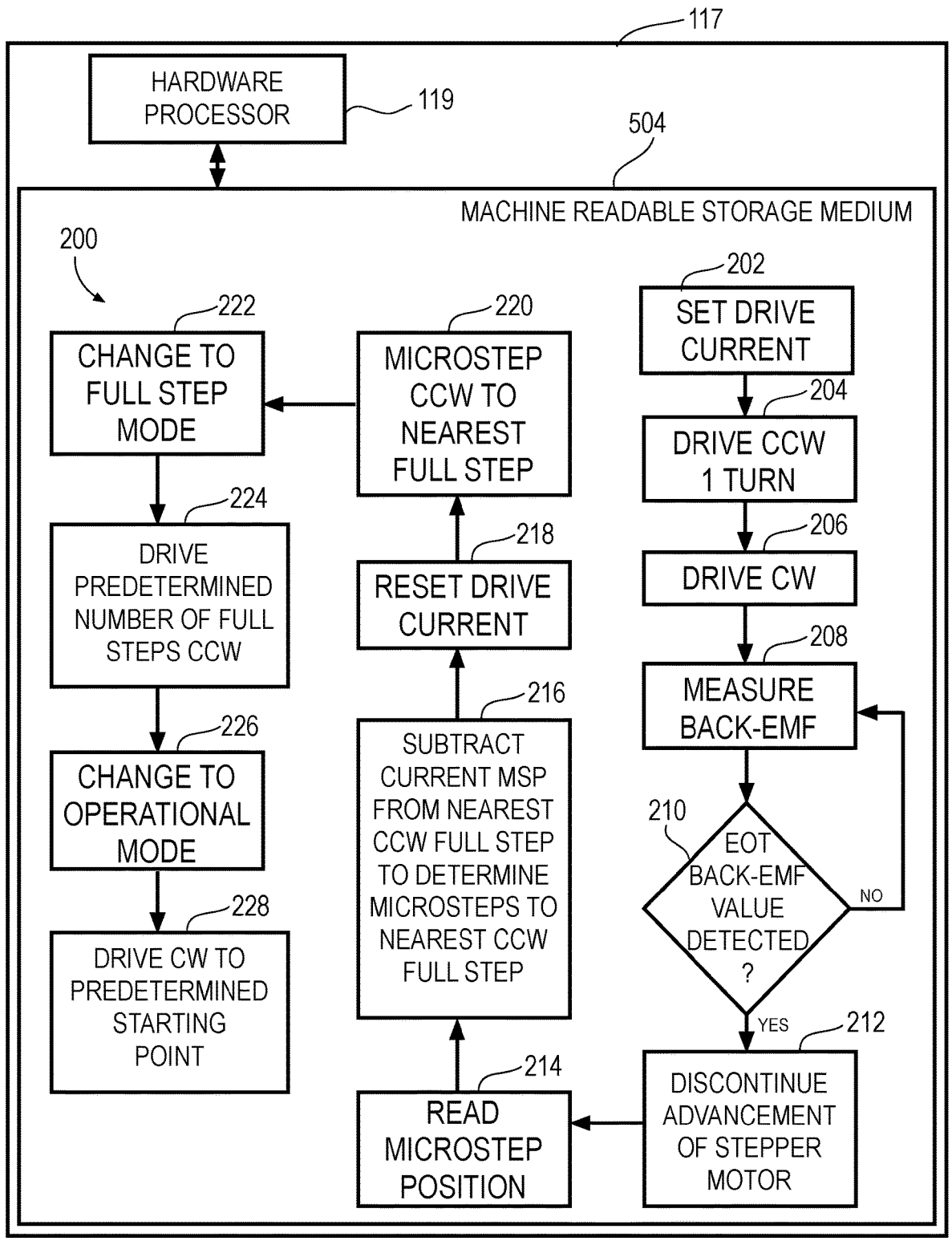
FIG. 5 is a block diagram of a stepper motor controller according to one or more examples.

FIG. 5 is a block diagram of motor controller 117 implementing the method 200 of controlling stepper motor 115 according to one or more examples. As previously noted, motor controller 117 may include at least one hardware processor 119 and a machine-readable storage medium 504. As illustrated, machine readable medium 504 may store instructions, that when executed by hardware processor 502 (either directly or via emulation/virtualization), cause hardware processor 502 to perform the method 200 described above with reference to FIG. 2.

A computer-readable media may be any available media that may be accessed by a computer. By way of example, such computer-readable media may comprise random access memory ("RAM"), read-only memory ("ROM"), electrically-erasable/programmable read-only memory ("EEPROM"), compact disc ROM ("CD-ROM") or other optical disk storage, magnetic disk storage or other magnetic storage devices, or any other medium that may be used to carry or store desired program code in the form of instructions or data structures and that may be accessed by a computer. Disk and disc, as used herein, includes compact disc ("CD"), laser disc, optical disc, digital versatile disc ("DVD"), floppy disk and Blu-ray® disc where disks usually reproduce data magnetically, while discs reproduce data optically with lasers.

Note also that the software implemented aspects of the subject matter hereof are usually encoded on some form of program storage medium or implemented over some type of transmission medium. The program storage medium is a non-transitory medium and may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The claimed subject matter is not limited by these aspects of any given implementation.

Figure 6:
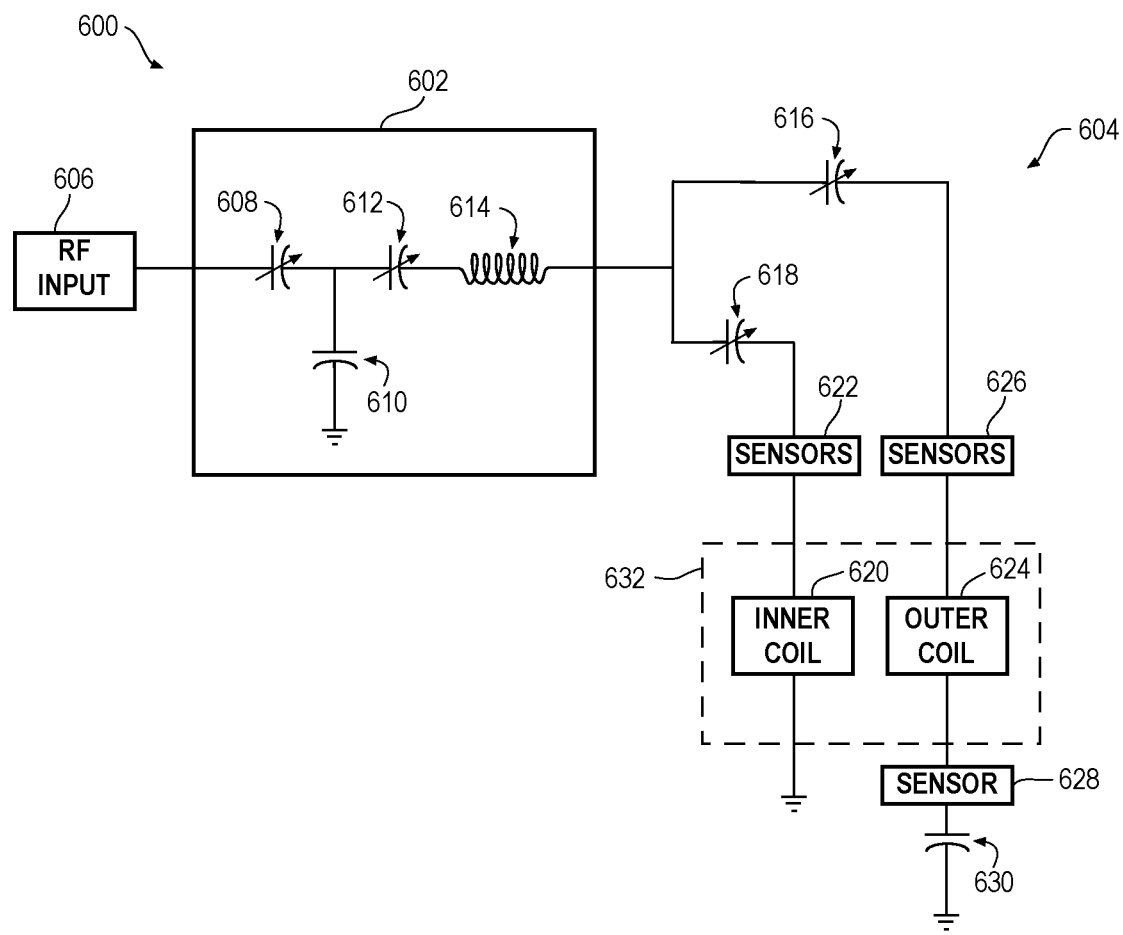
FIG. 6 is a schematic diagram of a matching network including one or more variable capacitors according to one or more examples.

FIG. 6 depicts an example of a matching network 604 utilizing one or more vacuum variable capacitors, such as the vacuum variable capacitors from the examples of FIGS. 1A and 1B, for tuning and otherwise controlling matching network 604 in a radio frequency plasma processing device. RF plasma-enhanced processing is extensively used in semiconductor manufacturing to etch different types of films, deposit thin films at low to intermediate processing temperatures, and perform surface treatment and cleaning. One characteristic of such processes is the employment of a plasma, i.e., a partially ionized gas, that is used to generate neutral species and ions from precursors inside a reaction chamber, provide energy for ion bombardment, and/or perform other actions. Radio frequency plasma-enhanced processing is performed by what are known as radio frequency processing devices.

Radio frequency processing devices may include a radio frequency generator that transmits a signal to a plasma reaction chamber. A radio frequency matching device, which may have a variable impedance, may be located between the radio frequency generator and the plasma reaction chamber. The radio frequency matching device may be controlled, or otherwise tuned by varying the impedance of the radio frequency matching device. Tuning the radio frequency matching device reduces reflected power from the plasma reaction chamber and/or the radio frequency matching device, which may increase power that is transferred from the radio frequency generator to the plasma reaction chamber and into the plasma process. During operation, a radio frequency generator may be energized to form a plasma within a reaction chamber. The plasma may be produced after a source gas is injected into the reaction chamber and power is supplied within the reaction chamber by the radio frequency generator.

Under certain conditions, the power that is supplied to the reaction chamber may be reflected back from the reaction chamber. One cause of the reflected power may be a mismatch in the characteristic impedance of the system and the load formed by the plasma within the reaction chamber. To help prevent reflected power, a matching network may be disposed between the radio frequency generator and the reaction chamber. Such matching networks may include a number of variable capacitors or other impedance elements. The variable capacitors may be tuned so that the complex load impedance within the reaction chamber matches the impedance of the radio frequency generator.

While multiple methods of controlling or otherwise tuning matching networks have been used, such methods may not reliably and efficiently result in impedance matching. Matching networks may include stepper motors, which have a specific number of steps that are a function unique to a particular stepper motor. During operation, a capacitor may be driven by a motor that has a range between zero and one hundred percent and the motor may, as a result, have a number of clicks. Embodiments of the present disclosure may provide recipes and/or otherwise allow for the adjustment of a capacitor position based, at least in part, on "a steps to percent ratio."

With reference to FIG. 6, matching network 604 including variable capacitors (which may include variable capacitor 100 as discussed above) according to one or more examples is shown. In example of FIG. 6, a matching network 600 is illustrated having a matching branch 602 and a splitter branch 604. Matching branch 602 receives radio frequency power from a radio-frequency (RF) input 606. A first variable capacitor 608 of the matching branch 602 receives RF power from RF input 606. First variable capacitor 608 may be a variable capacitor such as that disclosed herein with reference to FIGS. 1A and 1B, and may be rated at approximately 10-2000 pF.

In the example of FIG. 6, first variable capacitor 608 is connected to a second capacitor 610, which is connected to ground. Second capacitor 610 is also connected to a third variable capacitor 612. Third variable capacitor 612 may also be a variable capacitor such as that disclosed herein with reference to FIGS. 1A and 1B and may be rated at approximately 10-2000 pF. Third variable capacitor 612 is also connected to an inductor 614, which further connects to splitter branch 604.

Splitter branch 604 receives RF power from matching branch 602, which, splits the received RF power between a fourth variable capacitor 616 and a fifth variable capacitor 618. Fourth variable capacitor 616 and fifth variable capacitor 618 may also be variable capacitors such as that disclosed herein with reference to FIGS. 1A and 1B and may be rated at approximately 10-2000 pF.

Fifth variable capacitor 618 is connected to an inner coil 620. Between fifth variable capacitor 618 and inner coil 620, one or more sensors 622 may be disposed. Sensor(s) 622 may be used to measure, for example, voltage between fifth variable capacitor 618 and ground. Similarly, fourth variable capacitor 616 is connected to an outer coil 624. Between fourth variable capacitor 616 and outer coil 624, one or more sensors 626 may be disposed. Sensors 626 may be used to measure, for example, voltage between fourth variable capacitor 616 and ground.

Inner coil 620 may further be connected to a ground and outer coil 624 may be connected to circuitry that includes a sensor 628 and a sixth capacitor 630. Sensor 628 may be used to measure, for example, voltage between outer coil 624 and ground. Inner coil 620 and outer coil 624 may be located outside of the matching network 600, as indicated by dashed line 632 in FIG. 6.

Matching network 600 in the example of FIG. 6 may be used to tune first variable capacitor 608, third variable capacitor 612, fourth variable capacitor 616, and fifth variable capacitor 618. By tuning first variable capacitor 608, third variable capacitor 612, fourth variable capacitor 616, and fifth variable capacitor 618, the power provided to inner coil 620 and outer coil 624 may be adjusted.

The circuitry, which in one embodiment may be employed in matching network 600 as a current split ratio matching network, may be controlled using processor, microprocessor, microcontroller, or a programmable logic controller (not shown in FIG. 6), which may be disposed in or otherwise connected to matching network 600.

The foregoing description, for purposes of explanation, uses specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. Examples herein are not intended to be exhaustive of or to limit this disclosure to the precise forms described. Many modifications and variations are possible in view of the above teachings.

For example, although implementations are described herein incorporating two coaxial capacitor plate pairs, it is contemplated that in other examples, more than two coaxial plate pairs may be incorporated. Furthermore, although examples described herein involve two or more movable coaxial plates moving simultaneously with respect to two or more fixed coaxial plates, it is contemplated that in other examples, one or more of the coaxial plates may be advanced or retracted independently of others.

The examples herein are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A method for homing a stepping motor having a plurality of full-step positions within each full rotation of a rotor of the stepper motor, the method comprising:
    applying a first drive current to windings of the stepper motor, the first drive current to rotate the rotor of the stepper motor at least one full rotation in a first direction away from an end-of-travel (EOT) position;
    applying a second drive current to the windings of the stepper motor, the second drive current to rotate the rotor of the stepper motor in a second direction toward the EOT position;
    discontinuing application of the second drive current upon detection that the EOT position has been reached;
    determining a distance of the rotor from a closest full-step position of the stepper motor; and
    applying a third drive current to the windings of the stepper motor, the third drive current to rotate the rotor of the stepper motor in micro-steps and in the first direction to the closest full-step position of the stepper motor.

2. The method of claim 1, wherein the detection that the EOT position has been reached comprises detecting a predetermined level of back electromotive force ("back-EMF") in windings of the stepper motor.

3. The method of claim 2, wherein detection of a level of back-EMF does not require a position encoder for detecting position of the rotor.

4. The method of claim 1, wherein the stepper motor is coupled to a movable electrode assembly of a variable capacitor.

5. The method of claim 2, wherein:
    after applying the third drive current to rotate the rotor of the stepper motor in micro-steps and in the first direction to the closest full-step position of the stepper motor, driving the stepper motor a predetermined number of full steps in the first direction.

6. The method of claim 2, wherein:
    the detection of a level of back-EMF comprises:
        digitizing a back-EMF level of the stepper motor;
        deriving a simple moving average of the digitized back-EMF;
        filtering the simple moving average of the digitized back-EMF with an exponential moving average ("EMA") filter;
        subtracting a delayed moving average of the digitized back-EMF signal from the output of the EMA filter and squaring the result;
        comparing the squared result to a predetermined reference value to identify the EOT position.

7. A controller for a stepper motor, comprising:
    an analog-to-digital converter ("ADC") for providing a digital signal reflecting a level of back electromotive force ("back-EMF") in windings of the stepper motor to a processor;
    wherein the processor is programmed to:
    a comparison function for comparing the detected level of back-EMF in the windings of the stepper motor to a predetermined reference level; and
    wherein the controller determines that a stepper motor has reached an end-of-travel position based on the comparison of the detected level of back-EMF to the predetermined reference level.

8. The controller of claim 7, wherein the comparison function includes:
    a simple moving average function for computing a moving average of the digital signal reflecting a level of back-EMF;
    an exponential moving average ("EMA") filter function for filtering the simple moving average of the digitized back-EMF with
    a subtraction function for subtracting a delayed moving average of the digitized back-EMF signal from the output of the EMR filter
    a squaring function for squaring the output of the subtraction circuit;
    a comparison function for comparing the output of the squaring circuit to a predetermined reference value to identify the EOT position.

9. The controller of claim 7, wherein the controller does not include an encoder for determining a position of the rotor.

10. A variable capacitor, comprising
    a movable electrode assembly;
    a stepper motor having a rotor coupled to an actuator;
    a thrust collar, coupled to the actuator and to the electrode assembly, the rotation of the rotor of the stepper motor causing movement of the electrode assembly;
    a motor controller, comprising:
        a processor for determining a level of back electromotive force ("back-EMF") in windings of the stepper motor and comparing the detected level of back-EMF in the windings of the stepper motor to a predetermined reference level;

wherein the controller determines that a stepper motor has reached an end-of-travel position based on the comparison of the detected level of back-EMF to the predetermined reference level.

11. The variable capacitor of claim 10, wherein the controller includes:
   an analog-to-digital converter ("ADC") for digitizing a back electromotive force ("back-EMF") value of the stepper motor; and
   a processor for performing:
   a simple moving average function for computing a moving average of the digitized back-EMF value;
   an exponential moving average ("EMA") filter function for filtering the simple moving average of the digitized back-EMF with
   a subtraction function for subtracting a delayed moving average of the digitized back-EMF signal from the output of the EMR filter
   a squaring function for squaring the output of the subtraction circuit;
   a comparison function for comparing the output of the squaring function to a predetermined reference value to identify the EOT position.

12. The variable capacitor of claim 10, wherein the controller does not include an encoder for determining a position of the rotor.

13. The variable capacitor of claim 10, wherein the variable capacitor is included in a matching network for a radio frequency plasma processing device.

14. A non-transitory computer readable medium comprising computer executable instructions stored therein that, when executed by one or more processing units, cause the one or more processing units to:
   apply a first drive current to windings of the stepper motor, the first drive current to rotate the rotor of the stepper motor at least one full rotation in a first direction away from an end-of-travel (EOT) position;
   apply a second drive current to the windings of the stepper motor, the second drive current to rotate the rotor of the stepper motor in a second direction toward the EOT position;
   discontinue advancement of the stepper motor upon detection that the EOT position has been reached;
   determine a distance of the rotor from a closest full-step position of the stepper motor; and
   apply a third drive current to the windings of the stepper motor, the third drive current to rotate the rotor of the stepper motor in micro-steps and in the first direction to the closest full-step position of the stepper motor.

* * * * *